(12) United States Patent
Omori (10) Patent No.: US 10,452,577 B2
(45) Date of Patent: Oct. 22, 2019

(54) RECORDING APPARATUS, CONTROL METHOD, AND STORAGE MEDIUM

(71) Applicant: CANON KABUSHIKI KAISHA, Tokyo (JP)

(72) Inventor: Noboru Omori, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/934,331

(22) Filed: Mar. 23, 2018

(65) Prior Publication Data

US 2018/0276152 A1    Sep. 27, 2018

(30) Foreign Application Priority Data

Mar. 24, 2017   (JP) .................................. 2017-059691

(51) Int. Cl.
*G06F 12/00* (2006.01)
*G06F 13/00* (2006.01)
*G06F 13/16* (2006.01)
*G06F 3/06* (2006.01)

(52) U.S. Cl.
CPC ........ *G06F 13/1689* (2013.01); *G06F 3/0619* (2013.01); *G06F 3/0631* (2013.01); *G06F 3/0643* (2013.01); *G06F 3/0656* (2013.01); *G06F 3/0673* (2013.01); *G06F 13/1673* (2013.01)

(58) Field of Classification Search
CPC ............... G06F 13/1389; G06F 3/0659; G06F 2213/3804; G11C 7/22; G11C 7/1072

USPC ......................................................... 711/167
See application file for complete search history.

(56) References Cited

U.S. PATENT DOCUMENTS

| | | | |
|---|---|---|---|
| 6,556,505 B1* | 4/2003 | Tojima ....................... G06F 1/10 365/194 |
| 2003/0002316 A1* | 1/2003 | Morita ................. G11C 7/1045 365/63 |
| 2007/0152723 A1* | 7/2007 | Ahn .......................... G11C 7/22 327/158 |
| 2009/0154256 A1* | 6/2009 | Kim ...................... G11C 7/1051 365/189.05 |
| 2016/0182063 A1* | 6/2016 | Seo ........................ H03L 7/0812 327/149 |

(Continued)

FOREIGN PATENT DOCUMENTS

JP         2012-054715 A    3/2012

*Primary Examiner* — Sean D Rossiter
(74) *Attorney, Agent, or Firm* — Carterm DeLuca & Farrell LLP (57) ABSTRACT

There is provided a recording apparatus. An adjustment unit executes adjustment processing for adjusting a delay amount of a timing signal. A recording control unit performs recording control for performing recording of data to a file in a storage medium using an input/output unit configured to receive data from the storage medium according to the timing signal, and changes a recording destination of data from the file to a new file in response to a data amount recorded in the file reaching a threshold or more. A control unit controls such that the adjustment processing is performed in response to a sum of the data amount recorded in the file and a first data amount that is greater than or equal to a data amount corresponding to one instance of recording using the input/output unit reaching the threshold or more.

12 Claims, 7 Drawing Sheets

(56) References Cited

U.S. PATENT DOCUMENTS

2016/0284385 A1\* 9/2016 Nomura ................ G06F 1/3284
2018/0278257 A1 9/2018 Omori
2018/0284998 A1\* 10/2018 Omori ................... G06F 3/0679

\* cited by examiner

RECORDING APPARATUS, CONTROL METHOD, AND STORAGE MEDIUM

BACKGROUND OF THE INVENTION

Field of the Invention

The present invention relates to a recording apparatus, a control method, and a storage medium.

Description of the Related Art

Conventionally, there are apparatuses for writing image data, audio data and the like to a storage medium such as a memory card and the like, and reading out and reproduce data recorded in the storage medium. Reading/writing of data between an apparatus (host apparatus) to which the storage medium is connected and the storage medium is performed in accordance with clock signals generated in the host apparatus. After host apparatus transmits a clock pulse of a clock signal, transmission/reception of the data to be written or read-out, or reception of a response corresponding to a command is performed. For this reason, the clock pulse is not transmitted/received at a timing completely synchronized with the transmission/reception of the data and the response. For example, when the host apparatus performs reading-out of the data from a storage medium such as an SD memory card, a delay of a standardized fixed value exists after the clock pulse is given from the host apparatus to the storage medium and until data transmission is performed. For this reason, the host apparatus acquires the data transmitted from the storage medium by latching the data transmitted from the storage medium at a timing delayed by the fixed value after transmission of the clock pulse.

On the other hand, in recent years, due to improvement of data rate for reading/writing to such a storage medium, acceleration of the clock pulse frequency has been necessary, which has made it difficult for the delay amount from the clock pulse for acquiring the data to be defined by a fixed value. In view of this, UHS-I (Ultra High Speed I), a high speed standard of SD cards, defines that reading-out of data should be performed after adjusting a data latch timing for each card when performing reading-out of data using a high-speed clock. Such adjustment work for latch timing is called tuning (e.g. see Japanese Patent Laid-Open No. 2012-54715).

In addition, moving image data stored in a memory card is managed as a file in a predetermined file system. Among such file systems, for example, an upper limit of the size of one file is defined as 4 gigabytes (GB) in a FAT 32 file system. When recording large-size data such as moving image data, sometimes the data size of a recording destination file reaches the upper limit defined for the file system during recording of the moving image. There is also an image capturing apparatus that closes the current file, creates a new moving image file, and continues recording the moving image data in such a case. In this way, the function (processing) of recording a moving image while switching the recording destination file will hereinafter be referred to as a file break function (processing).

In file break processing, moving image data, as well as additional information of the moving image data and managing information such as a directory entry need to be written to a file. Therefore, the moving image data temporarily cannot be written to a memory card. As a result, during file break processing, due to the increase in moving image data that has been shot and is yet to be recorded, an available capacity in a buffer memory in which unrecorded moving image data is temporarily stored may decrease. Accordingly, if write errors and retries occur due to a deviation in the timing of receiving a response from the memory card during the file break processing, and the file break processing is prolonged, the buffer memory may overflow and moving image recording may stop. If tuning is performed, the deviation in the timing can be fixed, but writing and reading of data cannot be performed during the tuning. For this reason, if tuning is performed during file break processing, the likelihood that the buffer memory will overflow increases. Even if tuning is performed beforehand (e.g. before the start of recording a moving image), the proper latch timing changes depending on temperature and the like. If the temperature of an image capturing apparatus or a memory card changes during recording of the moving image, due to a change in a clock phase for receiving, it is not possible to sufficiently reduce the likelihood that write errors and the like will occur during file break processing.

SUMMARY OF THE INVENTION

The present invention has been made in view of the above circumstances and provides a technique for decreasing the likelihood that write errors and the like will occur during processing for switching a recording destination file, which is performed partway through data recording.

According to a first aspect of the present invention, there is provided a recording apparatus comprising: an output unit configured to output a clock signal to a storage medium; an input/output unit configured to output a write command and data to be written to the storage medium according to the clock signal in order to write data to the storage medium, and configured to receive data from the storage medium according to a timing signal; a generation unit configured to generate the timing signal by delaying the clock signal; an adjustment unit configured to execute adjustment processing for adjusting a delay amount of the timing signal; a recording control unit configured to perform recording control for performing recording of data to a file in the storage medium using the input/output unit, and configured to change a recording destination of data from the file to a new file in response to a data amount recorded in the file reaching a threshold or more; a control unit configured to control such that the adjustment processing is performed in response to a sum of the data amount recorded in the file and a first data amount that is greater than or equal to a data amount corresponding to one instance of recording using the input/output unit reaching the threshold or more.

According to a second aspect of the present invention, there is provided a control method executed by a recording apparatus comprising: an output unit configured to output a clock signal to a storage medium; an input/output unit configured to output a write command and data to be written to the storage medium according to the clock signal in order to write data to the storage medium, and configured to receive data from the storage medium according to a timing signal; and a generation unit configured to generate the timing signal by delaying the clock signal, the control method comprising: executing adjustment processing for adjusting a delay amount of the timing signal; performing recording control for performing recording of data to a file in the storage medium using the input/output unit, and changing a recording destination of data from the file to a new file in response to a data amount recorded in the file reaching a threshold or more; and controlling such that the adjustment processing is performed in response to a sum of the data amount recorded in the file and a first data amount that is greater than or equal to a data amount corresponding to one instance of recording using the input/output unit reaching the threshold or more.

According to a third aspect of the present invention, there is provided a computer-readable storage medium which stores a program for causing a computer of a recording apparatus to execute a control method, the recording apparatus comprising: an output unit configured to output a clock signal to a storage medium; an input/output unit configured to output a write command and data to be written to the storage medium according to the clock signal in order to write data to the storage medium, and configured to receive data from the storage medium according to a timing signal; and a generation unit configured to generate the timing signal by delaying the clock signal, the control method comprising: executing adjustment processing for adjusting a delay amount of the timing signal; performing recording control for performing recording of data to a file in the storage medium using the input/output unit, and changing a recording destination of data from the file to a new file in response to a data amount recorded in the file reaching a threshold or more; and controlling such that the adjustment processing is performed in response to a sum of the data amount recorded in the file and a first data amount that is greater than or equal to a data amount corresponding to one instance of recording using the input/output unit reaching the threshold or more.

Further features of the present invention will become apparent from the following description of exemplary embodiments (with reference to the attached drawings).

DESCRIPTION OF THE EMBODIMENTS

Hereinafter, embodiments of the present invention will be described with reference to the attached drawings. It should be noted that the technical scope of the present invention is defined by the claims, and is not limited by the following respective embodiments. Also, not all of the combinations of the aspects that are described in the embodiments are necessarily essential to the present invention. Also, the aspects that are described in the respective embodiments can be combined as appropriate.

First Embodiment

Figure 1:
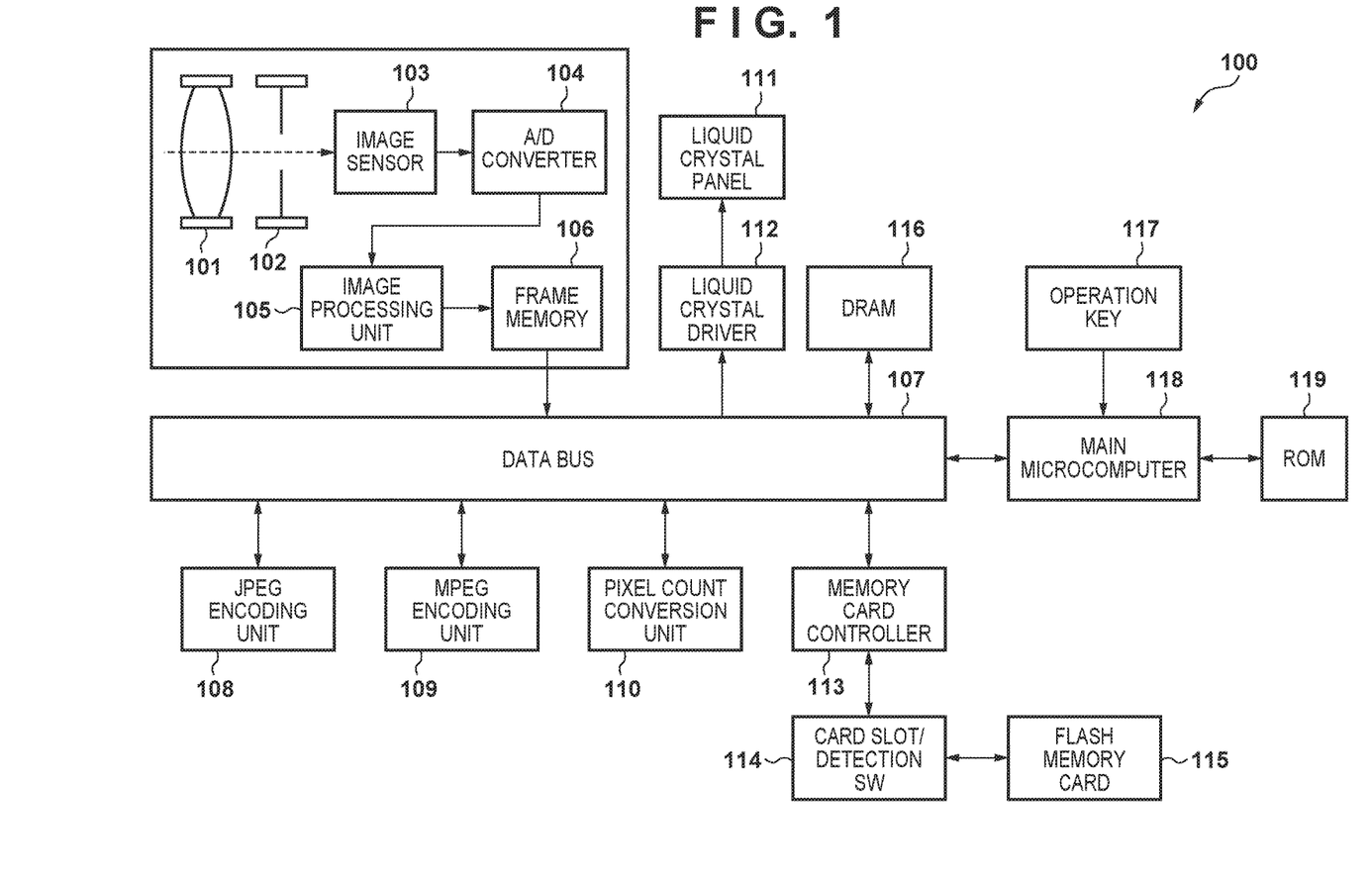
FIG. 1 is a block diagram showing a configuration example of a digital camera 100.

An embodiment will be described in which a recording apparatus of the present invention is applied to an image capturing apparatus such as a digital camera. FIG. 1 is a block diagram showing a configuration example of a digital camera 100 according to a first embodiment. In FIG. 1, a photographic lens 101 captures a subject image, and forms the subject image on an image sensor 103 after a light amount is limited to a predetermined amount by a diaphragm 102. The formed subject image is digitized by an A/D converter 104. After an image processing unit 105 performs gamma compensation, white balance compensation, noise reduction, and the like, the digitized image data is output to a data bus 107 as uncompressed image data.

A JPEG encoding unit 108 performs compression-encoding on the uncompressed image data to a still image, and generates JPEG still image data. An MPEG encoding unit 109 performs compression-encoding on the uncompressed image data to a moving image, and generates MPEG moving image data.

A liquid crystal panel 111 is a display unit that displays images and various kinds of information. A liquid crystal driver 112 converts data for image display stored in the DRAM 116 to liquid crystal display signals, and supplies the signals to the liquid crystal panel 111. In this way, the image data to be displayed that was written to the DRAM 116 is displayed by the liquid crystal panel 111 via the liquid crystal driver 112. The liquid crystal panel 111 can also function as an electronic viewfinder and perform through-image display. When the liquid crystal panel 111 is caused to function as the electronic viewfinder, the liquid crystal driver 112 reduces the resolution of digital signals that were once A/D converted by the A/D converter 104 and accumulated in the DRAM 116, according to dot count of the liquid crystal panel 111. After that, the liquid crystal driver 112 converts the digital signals to liquid crystal display signals, and sequentially transfers the liquid display signals to the liquid crystal panel 111.

The DRAM 116 is used also as a buffer memory for temporarily storing data to be recorded in a flash memory card 115, such as JPEG still image data generated in the JPEG encoding unit 108 or MPEG moving image data generated in the MPEG encoding unit 109. The data stored in the buffer memory space in the DRAM 116 is read out by the memory card controller 113 and written to the flash memory card 115 (storage medium). Writing/reading of data to/from the buffer memory space is controlled by the main microcomputer 118. In addition, the DRAM 116 also provides a working memory space for a pixel count conversion unit 110 that generates thumbnail images to be used for an index display during reproduction, from the captured images. Furthermore, as described above, the DRAM 116 also provides a space serving as a video memory for performing display on the liquid crystal panel 111.

The flash memory card 115 is a memory card that is attachable/detachable to/from the digital camera 100 via a card slot/detection SW 114, constituted by, for example, NAND type flash memory. The main microcomputer 118 manages data recorded in the flash memory card 115 as a file according to a predetermined file system such as a FAT (File Allocation Table) file system.

The memory card controller 113 controls the flash memory card 115 and records data from the DRAM 116 to the flash memory card 115. Also, the memory card controller 113 reads out data from the flash memory card 115 and performs data transfer to the DRAM 116. The card slot/detection SW 114 is a slot in which the flash memory card 115 is mounted, and includes a detection SW (switch) for detecting whether or not the flash memory card 115 is mounted in the slot.

Operation keys 117 are various kinds of switches that receive various operations from a user, and include a shutter button for performing an operation of capturing still images, a trigger button for instructing the start and stop of moving image capture, and a mode switch for switching between a camera capturing mode and a reproduction mode.

The ROM 119 is a non-volatile memory that is capable of electrically deleting/recording, and that stores constants, programs, and the like for operation of the main microcomputer 118. The program mentioned here is a program for executing various later-described sequences in the present embodiment, and realizes the later-described operations of the present embodiment.

The main microcomputer 118 has a CPU and operates according to the operation programs stored in the ROM 119, and controls the units of the digital camera 100. The main microcomputer 118 performs display control by controlling the liquid crystal driver 112 and the like. Also, in the present embodiment, the main microcomputer 118 utilizes tuning pattern signals with the same pattern as that stored in the flash memory card 115, and performs later-described judgment of whether or not a test pattern is successful, and an operation of determining the optimum latch timing.

Figure 2:
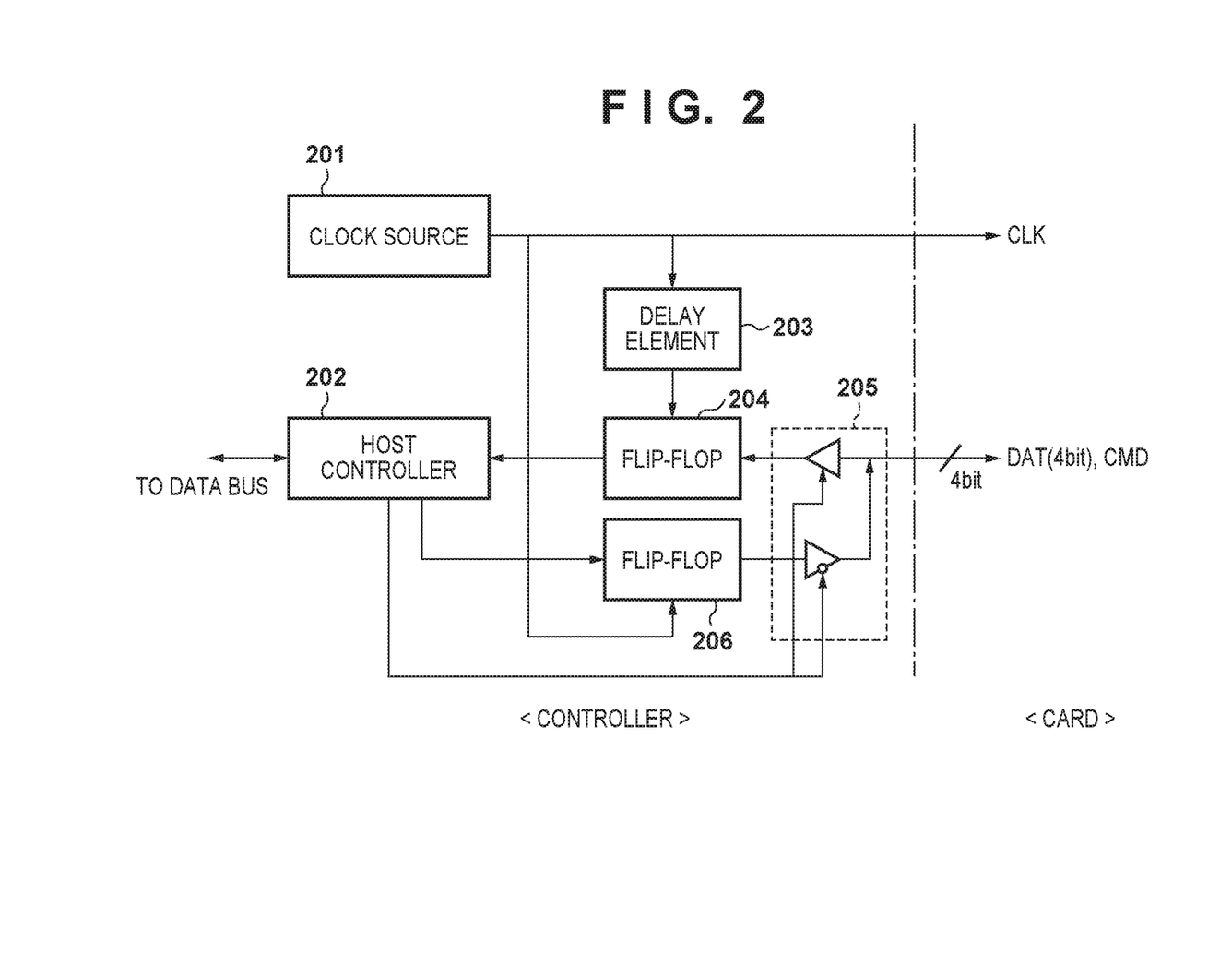
FIG. 2 is a block diagram showing detail of a memory card controller 113.

FIG. 2 is a block diagram showing the detail of the memory card controller 113. The memory card controller 113 performs transmission/reception of signals and data during writing and reading of data to and from the flash memory card 115 via a CLK line, a CMD line, and a DAT line. Specifically, a clock source 201 outputs clock signals (CLK signals) that are constituted by clock pulses and are used to control the timing of reading/writing to the flash memory card 115 via the CLK line.

The host controller 202 performs outputting of command signals related to reading/writing, and reception of response signals in response to the commands from the flash memory card 115, via the CMD line. Also, the host controller 202 performs control of transmitting/receiving data to be written to the flash memory card 115 or data read out from the flash memory card 115, via the DAT line. The host controller 202 transmits moving image data and still image data read from the buffer memory space in the DRAM 116, or other data, to the flash memory card 115 via the DAT line, in synchronization with clock signals from the clock source 201.

In reading and writing of data, as described above, the timing of the transmission/reception of the clock pulse is different from that of data. For this reason, a delay element 203 delays the phase of the clock signal according to control by the main microcomputer 118 when reading out data from the flash memory card 115, for example, and generates timing signals for receiving data output from the flash memory card 115. Then, a flip-flop 204 latches data output from the flash memory card 115 according to the timing signals output from the delay element 203. That is to say, the timing signals define the timing of latching data. Also, a flip-flop 206 latches data for writing from the host controller 202 according to the timing from the clock source 201. Note that switching between the CMD line and the DAT line according to input/output of commands and transmission/reception of data is performed by a signal branch unit 205. Responses and data from the flash memory card 115 that are output from the flip-flop 204 are sent to the host controller 202.

Next, a tuning operation of the present embodiment will be described with reference to FIGS. 1 and 2. The memory card controller 113 issues a test data transmission command to the flash memory card 115. In response to this, the flash memory card 115 transmits a data string (test data) of 64 bytes in a predetermined pattern in synchronization with a clock signal transmitted from the clock source 201. The memory card controller 113 receives the test data according to the timing signal that is obtained by delaying the clock signal generated from the clock source 201 by the delay element 203. Here, the phase of the timing signal can be changed by changing the value of the number of delay stages that is set in the delay element 203. The main microcomputer 118 judges whether or not the test data is successfully received, while changing the phase relationship between the clock signal and the timing signal, or in other words, while changing the latch timing of the flip-flop 204.

Specifically, the main microcomputer 118 transmits a command to transmit the test data to the flash memory card 115 in a state where the delay amount of the delay element 203 is set to a first delay amount. Then, the main microcomputer 118 uses the flip-flop 204 to receive the test data transmitted from the flash memory card 115 according to a timing signal with the first delay amount. The main microcomputer 118 compares the received test data to test data that is held in advance, and judges whether or not the test data was correctly received.

Upon completion of the reception processing of the test data according to the timing signal with the first delay amount, next, the main microcomputer 118 sets the delay amount of the delay element 203 to a second delay amount and causes the flash memory card 115 to send the command to transmit the test data again. Then, the main microcomputer 118 determines whether or not the test data received according to the timing signal with the second delay amount is correctly received.

In this way, the main microcomputer 118 repeats processing for determining whether or not the test data is correctly received at each delay amount, while changing the delay amount of the delay element 203. Note that the delay amount to be changed in one instance is about one several tenths of one cycle of a clock signal. Then, upon completion of the reception of the test data according to the timing signals with all the delay amounts, the main microcomputer 118 selects the delay amount with which the reception of the test data has succeeded the most stably, and sets this delay amount in the delay element 203 as the delay amount of the timing signal.

The series of processing described above is referred to as latch timing tuning processing (that is, processing for adjusting the delay amount of the timing signal). In this way, while tuning processing is performed, writing and reading of the image data to/from the flash memory card 115 cannot be performed.

Next, with reference to FIG. 3, processing will be described in which the digital camera 100 controls execution of tuning during recording of image data. Unless otherwise stated, processing in the steps in this flowchart is performed by the main microcomputer 118 executing operation programs stored in the ROM 119 to control the units of the digital camera 100.

Particularly, with reference to FIG. 3, an example of a moving image capturing mode for recording MPEG moving image data encoded using an MPEG encoding method accompanying inter-frame predictive encoding will be described. However, the present embodiment is not limited to inter-frame predictive encoding and MPEG encoding method, and can be applied to a case of recording any kind of moving image data is recorded. Furthermore, the data to be recorded is not limited to moving image data, and the present embodiment can be applied to a case where any data is repeatedly recorded.

During recording, the main microcomputer 118 needs to receive responses to write commands that have been output to the flash memory card 115, from the flash memory card 115. For this reason, even during recording, it is preferable that the memory card controller 113 receives the data transmitted from the flash memory card 115 at the proper latch timing. On the other hand, since images generated through moving image capturing are generally large in data size, if data writing is prevented by the tuning processing, the available capacity of the internal moving image data buffer decreases, which may lead to stopping of recording due to buffer overflow. If file break processing and tuning processing are performed simultaneously, the likelihood of buffer overflow is further increased. Accordingly, as described in detail below, the main microcomputer 118 performs tuning processing before file break processing is performed.

Figure 3:
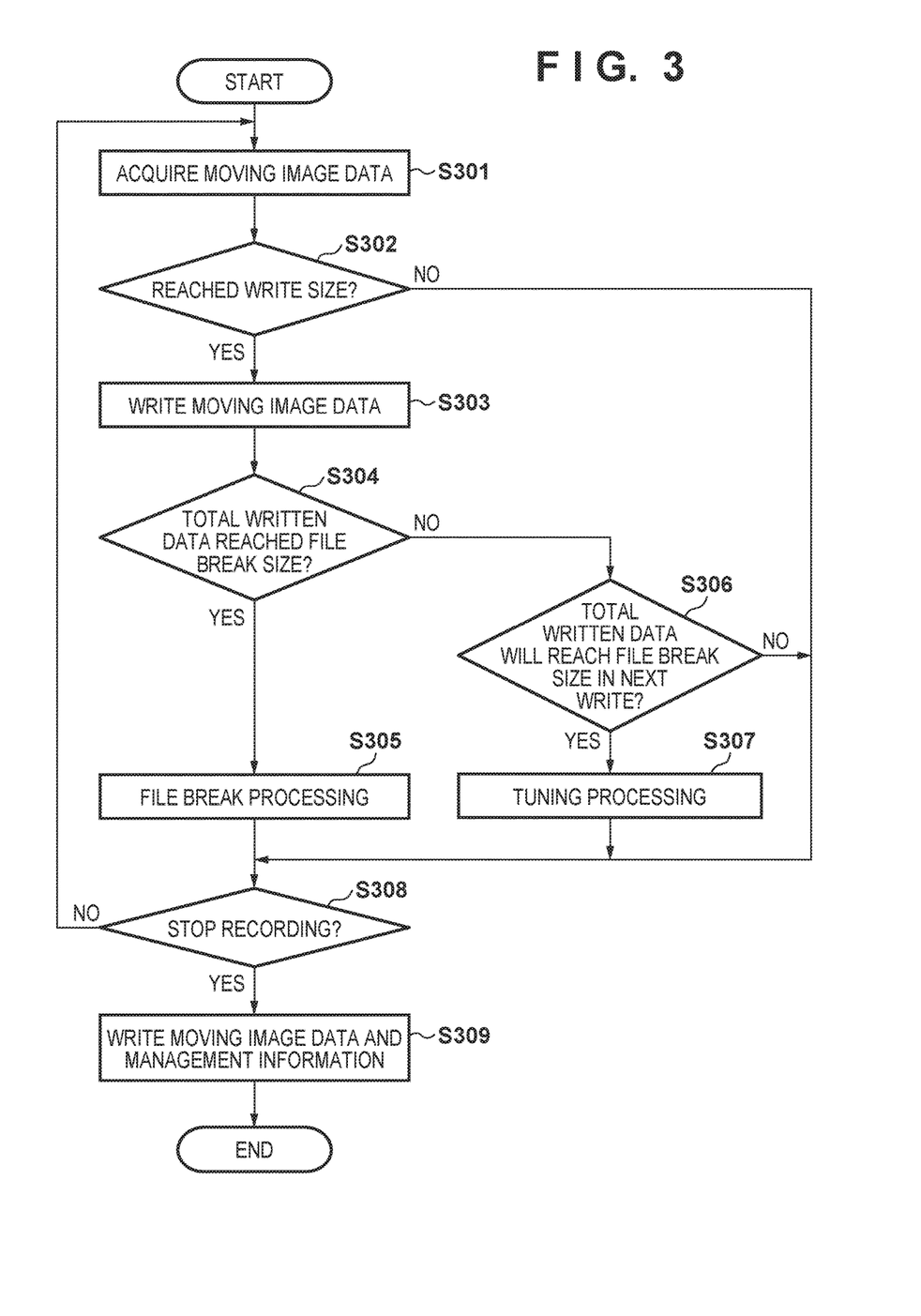
FIG. 3 is a flowchart of processing for controlling execution of tuning while the digital camera 100 is recording image data, according to a first embodiment.

When a user instructs the start of recording by operating the operation key 117, processing in the flowchart in FIG. 3 starts. First, in step S301, the main microcomputer 118 controls the MPEG encoding unit 109 so as to encode the moving image data and accumulate (input) the encoded moving image data in a moving image data buffer in the DRAM 116 allocated for moving image data.

In the present embodiment, the data writing speed to the flash memory card 115 is higher than the data rate of the encoded moving image data. Thus, when recording moving image data, the main microcomputer 118 temporarily stores the encoded moving image data in the buffer memory space in the DRAM 116. Then, when the data amount of the moving image data that is stored in the buffer memory and is yet to be recorded reaches a predetermined data amount, the main microcomputer 118 reads out the moving image data from the buffer memory and stores it in the flash memory card 115. Since the recording speed of the flash memory card 115 is higher than the data rate of the moving image data, the data amount of the moving image data stored in the buffer memory decreases while the moving image data is being written to the flash memory card 115. Then, when writing of the moving image data of a predetermined size to the flash memory card 115 is completed, the writing is stopped. In this way, in the present embodiment, in the period from when the recording of the moving image starts to when it stops, the recording control is performed such that the moving image data is intermittently (repeatedly) recorded in the flash memory card 115.

Next, in step S302, the main microcomputer 118 determines whether or not the total size α (in megabytes (MB)) of the moving image data accumulated in the moving image data buffer in the DRAM 116 has reached a write size β (MB). Here, the write size β is a data size which is written to the flash memory card 115 in one instance of write processing in the above-described intermittent (repeated) recording of moving image data. If the total size α of the moving image data accumulated in the moving image data buffer has reached the write size β, the processing advances to step S303, and if not, the processing advances to step S308.

In step S303, the main microcomputer 118 controls the memory card controller 113 to issue a write command to the flash memory card 115. Then, the main microcomputer 118 writes, to the flash memory card 115, the moving image data of the write size β accumulated in the moving image data buffer in the DRAM 116.

In step S304, the main microcomputer 118 determines whether or not the total size γ(MB) of the moving image data that has been written to the moving image file from the start of recording to the current time has reached to a file break size δ (gigabytes (GB)). If the total size γ of the moving image data that has been written has reached the file break size δ, the processing advances to step S305, and if not, the processing advances to step S306.

Here, the file break size δ is a threshold for determining whether or not to perform the file break processing, in which the recording of the moving image file that is currently being recorded is stopped, the moving image file is closed, and a new moving image file is created, during recording of the moving image data. In the present embodiment, the file break size δ is defined based on the upper limit of file size that is defined in a predetermined file system. For example, in the FAT 32 file system, the upper limit of file size is 4 GB. Therefore, in the present embodiment, the file break size δ is set to a value that is a predetermined amount less than 4 GB.

In step S305, the main microcomputer 118 performs file break processing. In other words, the main microcomputer 118 controls the memory card controller 113 to issue a write command to the flash memory card 115. Then, in order to close the moving image file currently being recorded, the main microcomputer 118 writes, to the flash memory card 115, the moving image data and the managing information accumulated in the moving image data buffer in the DRAM 116. Furthermore, in order to open a new moving image file, the main microcomputer 118 writes, to the flash memory card 115, the moving image data and the managing information that have been accumulated in the moving image data buffer in the DRAM 116.

In step S306, in order to determine whether or not the written size γ will reach the file break size δ due to the next write processing, the main microcomputer 118 determines whether or not the sum of the written size γ and the write size β has reached the file break size δ. If the sum of the written size γ and the write size β has reached file break size δ, the processing advances to step S307, and if not, the processing advances to step S308.

Note that, in step S306, a predetermined data size that is larger than β can also be used instead of the write size β. That is, in general, if the sum of the recorded (written) data amount (γ) and a first data amount that is larger than or equal to the data amount (β) corresponding to one instance of recording in repeated recordings is the threshold (δ) or more, the main microcomputer 118 advances the processing to step S307.

In step S307, the main microcomputer 118 controls the memory card controller 113 to perform tuning processing of the flash memory card 115. In this way, in the present embodiment, if it is predicted that the file break processing will be performed after the next instance of writing the moving image data, the main microcomputer 118 performs tuning processing before file break processing.

In step S308, the main microcomputer 118 determines whether or not to stop the recording of the moving image. For example, if the data capacity in flash memory card 115 becomes full, or if an instruction to stop the recording is given via the operation key 117, it is determined that the recording of the moving image is to be stopped. If the recording of the moving image is not stopped, the processing returns to step S301, and the main microcomputer 118 continues the recording of the moving image. If the recording of the moving image is stopped, the processing advances to step S309.

In step S309, in order to close the moving image file currently being recorded, the main microcomputer 118 writes, to the flash memory card 115, the moving image data and the managing information that have been accumulated in the moving image data buffer in the DRAM 116. Then, the main microcomputer 118 closes the moving image file and stops the recording of the moving image.

Figure 4:
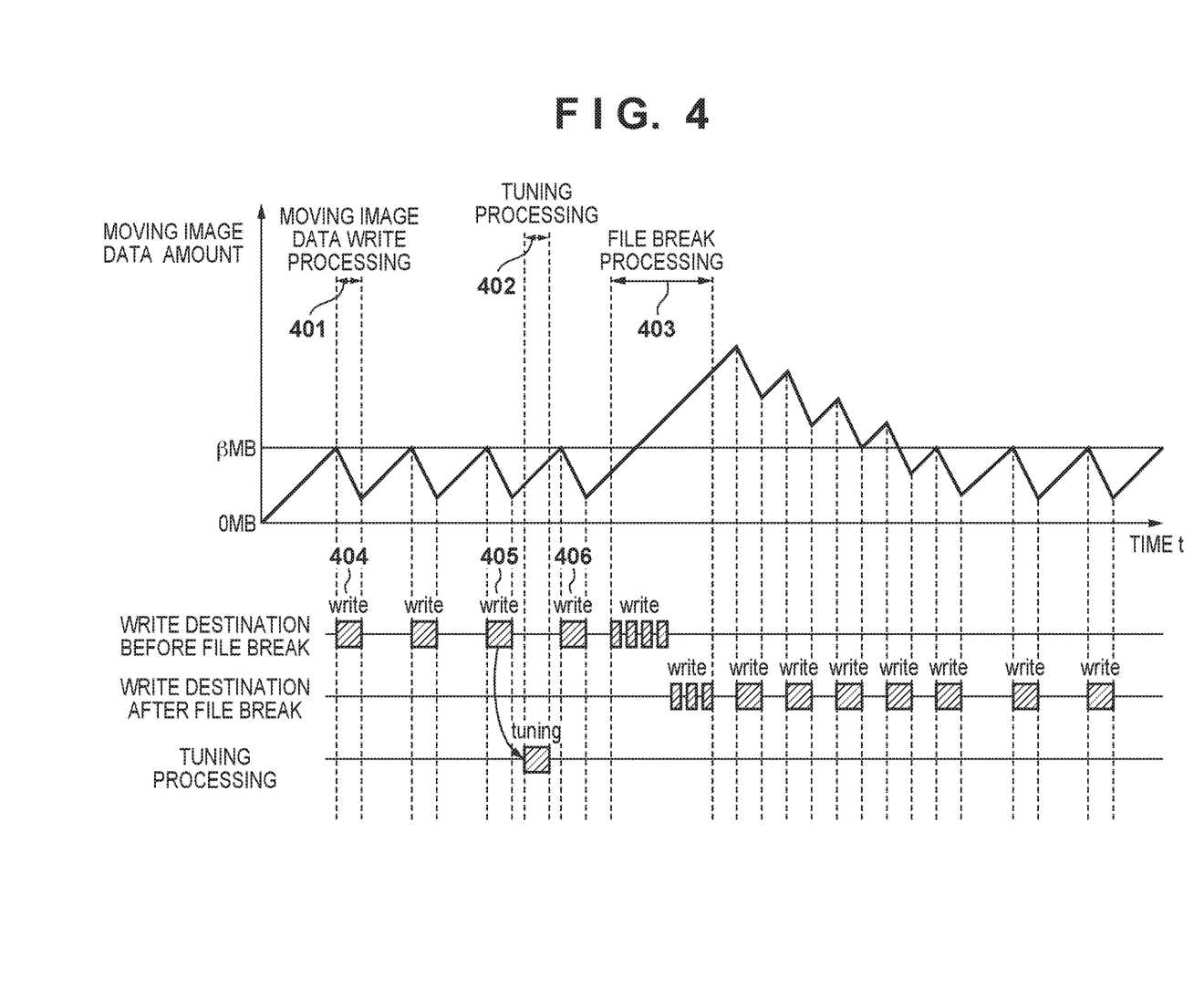
FIG. 4 is a diagram for describing a series of operations in the flowchart in FIG. 3.

FIG. 4 is a diagram showing a series of operations in the flowchart in FIG. 3 in chronological order, using transitions in the accumulation state in the moving image data buffer during the recording of the moving image, and the time for write processing and tuning processing. In FIG. 4, the vertical axis indicates the amount of moving image data accumulated in the moving image data buffer, and the horizontal axis indicates time "t". Note that the moving image data buffer is allocated to the DRAM 116.

Reference sign 401 indicates a period in which the moving image data accumulated in the moving image data buffer is written to the flash memory card 115 in step S303. Reference sign 402 indicates a period in which the tuning processing of the flash memory card 115 is performed in step S307. Reference sign 403 indicates a period in which the moving image data and the managing information are written to the flash memory card 115 accompanying the file break processing in step S305.

In writing timing 404 for the moving image data, the main microcomputer 118 determines that the sum of the written moving image data γ and the write size β has not reached the file break size δ.

In writing timing 405 for the moving image data, the main microcomputer 118 determines that the sum of the written moving image data γ and the write size β has reached the file break size δ, and performs tuning processing in a period 402. In this way, in the present embodiment, the main microcomputer 118 performs tuning processing before file break processing if it is predicted that the file break processing will be performed after the next instance of writing the moving image data. This tuning processing is executed in a period during which the moving image data is not being written to the flash memory card 115 and is being accumulated in the moving image data buffer in the DRAM 116.

After tuning processing, in writing timing 406 for the moving image data, the main microcomputer 118 determines that the total size γ of the moving image data written to the flash memory card 115 has reached the file break size δ. Then, the main microcomputer 118 performs data write processing for the file break processing. After the file break processing, the main microcomputer 118 continuously issues write commands to the flash memory card 115 until the size of the moving image data accumulated in the moving image data buffer becomes smaller than the write size β. At this time, when moving image data of the write size β is written in response to one write command, a response is sent from the flash memory card 115. Upon receiving the response from the flash memory card 115, the main microcomputer 118 issues the next write command.

As described above, according to the first embodiment, the digital camera 100 performs tuning processing before file break processing if it is predicted that the file break processing will be performed after the next instance of writing the moving image data. Thus, it is possible to reduce the likelihood that write errors and the like will occur during the processing for switching the recording destination file which is performed partway through data recording.

Second Embodiment

In the first embodiment, a case has been described in which the processing for switching the recording destination file is performed due to an upper limit being set for the data size (number of bits or bytes) of one file. However, the cause of performing the processing for switching the recording destination file is not limited to the upper limit of the data size (number of bits or bytes). For example, depending on the format of the moving image file, an upper limit is set to the frame count that can be recorded in one clip from the start of recording in some cases. In such a case, if the total frame count from the start of recording of one clip has reached the upper limit of the frame count defined by the format of the moving image file during the recording of the moving image, processing for dividing the clip (clip break processing) is performed. In clip break processing, similarly to file break processing, processing is performed to close the current file, create a new moving image file, and continue the recording of the moving image. A second embodiment will describe a configuration for reducing the likelihood that write errors and the like will occur during the processing for switching the recording destination file, taking a case of clip break processing as an example.

The first embodiment described a configuration in which tuning processing is performed before file break processing if it is predicted that the file break processing will be performed after the next instance of writing the moving image data. However, if the time required for the tuning processing is long, the data amount accumulated in the moving image data buffer during the tuning processing becomes large. Accordingly, if tuning processing is executed just before file break processing (or clip break processing), the file break processing is started in a timing in which the available capacity in the moving image data buffer is small, whereby the likelihood of buffer overflow increases. Therefore, in the second embodiment, a configuration will be described in which the timing for performing tuning is changed according to the tuning processing time.

In the present embodiment, the basic configuration of the digital camera 100 and the memory card controller 113 is similar to that of the first embodiment (see FIGS. 1 and 2). Hereinafter, the difference from the first embodiment will mainly be described.

Figure 5:
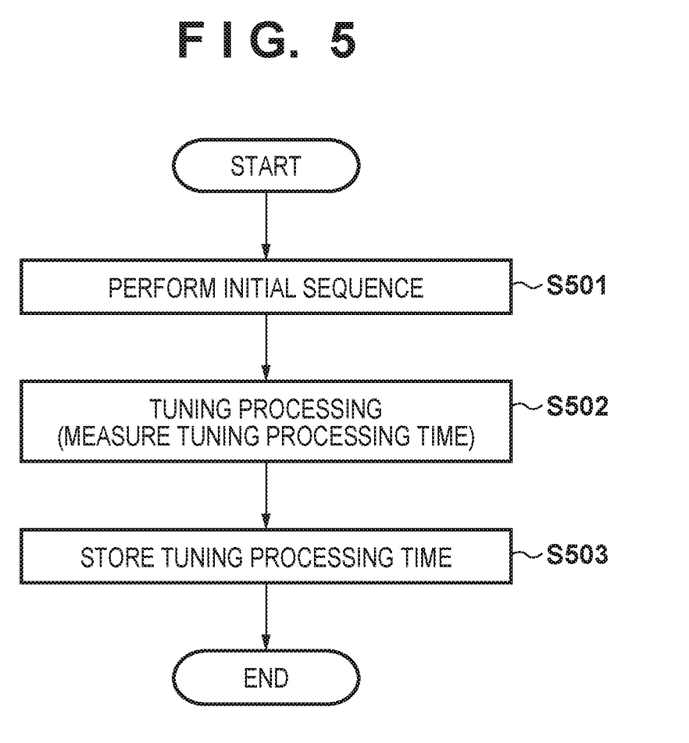
FIG. 5 is a flowchart of initial processing performed by the digital camera 100.

FIG. 5 is a flowchart of initial processing performed by the digital camera 100. Unless otherwise stated, processing in the steps in this flowchart is performed by the main microcomputer 118 executing operation programs stored in the ROM 119 to control the units of the digital camera 100. When a user mounts the flash memory card 115 to the digital camera 100 and a card slot/detection SW 114 detects the mounting of the flash memory card 115, the processing in this flowchart starts. The processing in FIG. 5 is performed after the user mounts the flash memory card 115 to the digital camera 100 and before the recording of the moving image data or reproduction of the moving image data in the flash memory card 115 is started according to the user's instruction.

First, in step S501, the main microcomputer 118 performs the initial sequence of the flash memory card 115 via the memory card controller 113. Next, in step S502, the main microcomputer 118 controls the memory card controller 113 to perform tuning processing of the flash memory card 115. At this time, the main microcomputer 118 measures the time that was required for the tuning processing (tuning processing time). In step S503, the main microcomputer 118 stores the tuning processing time acquired through the measurement in step S502, in the DRAM 116.

Figure 6:
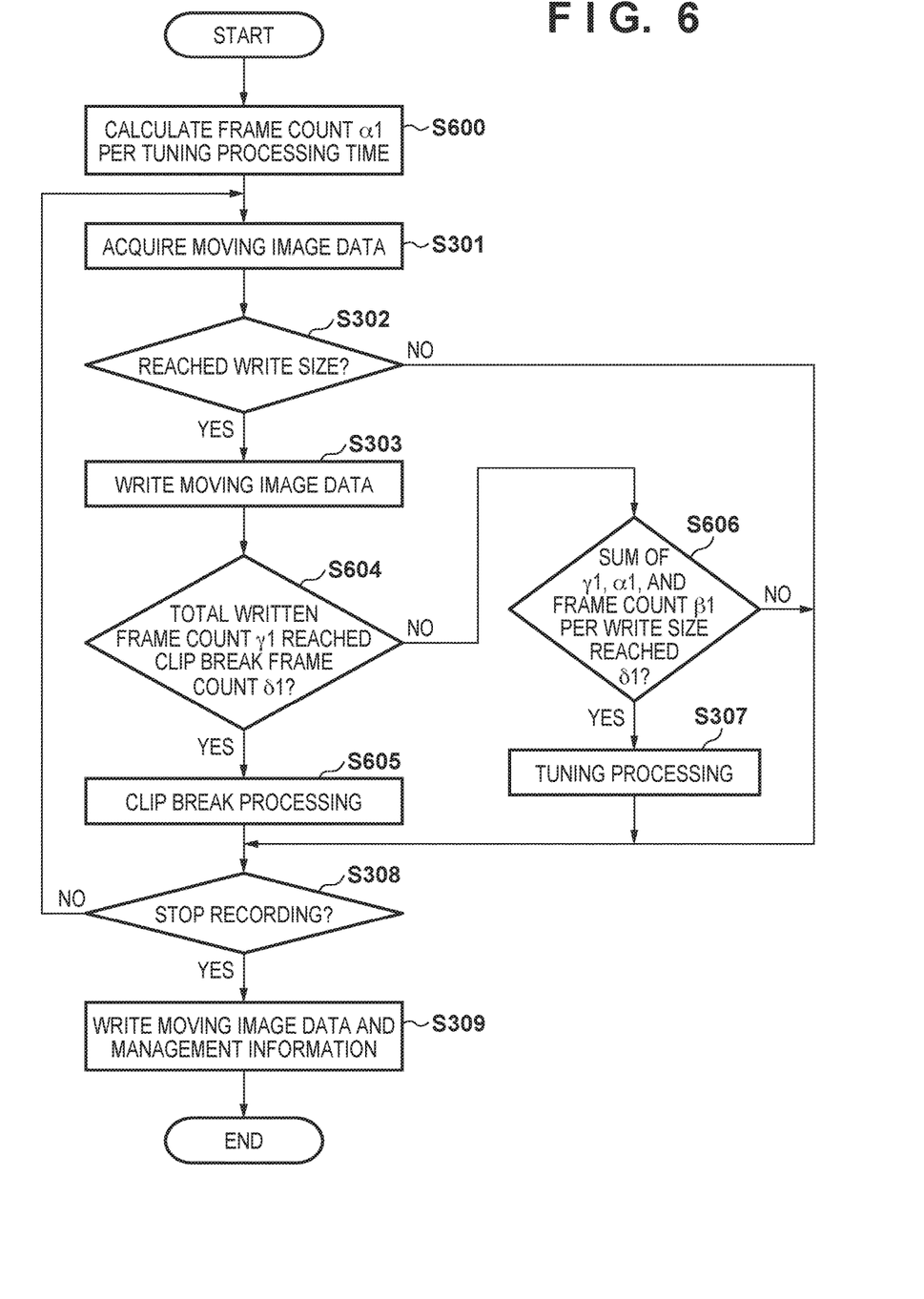
FIG. 6 is a flowchart of processing for controlling execution of tuning while the digital camera 100 is recording the image data, according to a second embodiment.

FIG. 6 is a flowchart of processing for controlling execution of tuning while the digital camera 100 is recording the image data. Unless otherwise stated, processing in the steps in this flowchart is performed by the main microcomputer 118 executing operation programs stored in the ROM 119 and controlling the units of the digital camera 100. In FIG. 6, the same reference signs are allocated to the steps in which processing that is the same or similar to that of FIG. 3 is performed, and the description thereof is omitted. Note that in FIG. 6, although the main microcomputer 118 performs clip break processing, file break processing that has been described in the first embodiment may also be performed in addition to the clip break processing.

When the user operates the operation key 117 to instruct the start of recording, the processing in the flowchart in FIG. 6 is started. First, in step S600, the main microcomputer 118 calculates frame count $\alpha 1$ per tuning processing time, based on the tuning processing time stored in the DRAM 116 and a set recording frame rate.

In step S604, the main microcomputer 118 determines whether or not the total frame count $\gamma 1$ of the moving image data that has been written to the moving image file from the start of recording to the current time has reached the clip break frame count $\delta 1$. The clip break frame count $\delta 1$ is a frame count upper limit defined by the format of the moving image file in the present embodiment, or a number smaller than that by a predetermined frame count. In the present embodiment, the upper limit of the frame count per clip is a frame count for six hours' worth of frames. Therefore, the upper limit of the frame count is 6 (hours)×60 (minutes)×60 (seconds)×n (frames per second). "n" is a frame rate of the moving image data to be recorded. If the total frame count $\gamma 1$ of the written moving image data has reached the clip break frame count $\delta 1$, the processing advances to step S605, and if not, the processing advances to step S606.

In step S605, the main microcomputer 118 performs clip break processing. In other words, the main microcomputer 118 controls the memory card controller 113 to issue a write command to the flash memory card 115. Then, in order to close the moving image file currently being recorded, the main microcomputer 118 writes, to the flash memory card 115, the moving image data and the managing information that have been accumulated in the moving image data buffer in the DRAM 116. Then, in order to open a new moving image file, the main microcomputer 118 writes, to the flash memory card 115, the moving image data and the managing information that have been accumulated in the moving image data buffer in the DRAM 116.

In step S606, the main microcomputer 118 determines whether or not the sum of the total frame count $\gamma 1$ of the written moving image data, the frame count $\alpha 1$ per tuning processing time, and the frame count $\beta 1$ per write size has reached the clip break frame count $\delta 1$. If the sum of $\gamma 1$, $\alpha 1$, and $\beta 1$ has reached $\delta 1$, the processing advances to step S307, and if not, the processing advances to step S308.

Note that the determination in step S606 means comparing the value acquired by adding the sum of $\alpha 1$ and $\beta 1$ to $\gamma 1$, to $\delta 1$, but it is also possible to add a value larger than or equal to the sum of $\alpha 1$ and $\beta 1$ to $\gamma 1$. The larger the value to be added to $\gamma 1$, the more reliably the available capacity in the moving image data buffer can be increased before the timing to perform clip break processing.

In this way, in the second embodiment, the main microcomputer 118 changes the tuning execution timing according to the tuning processing time.

Figure 7:
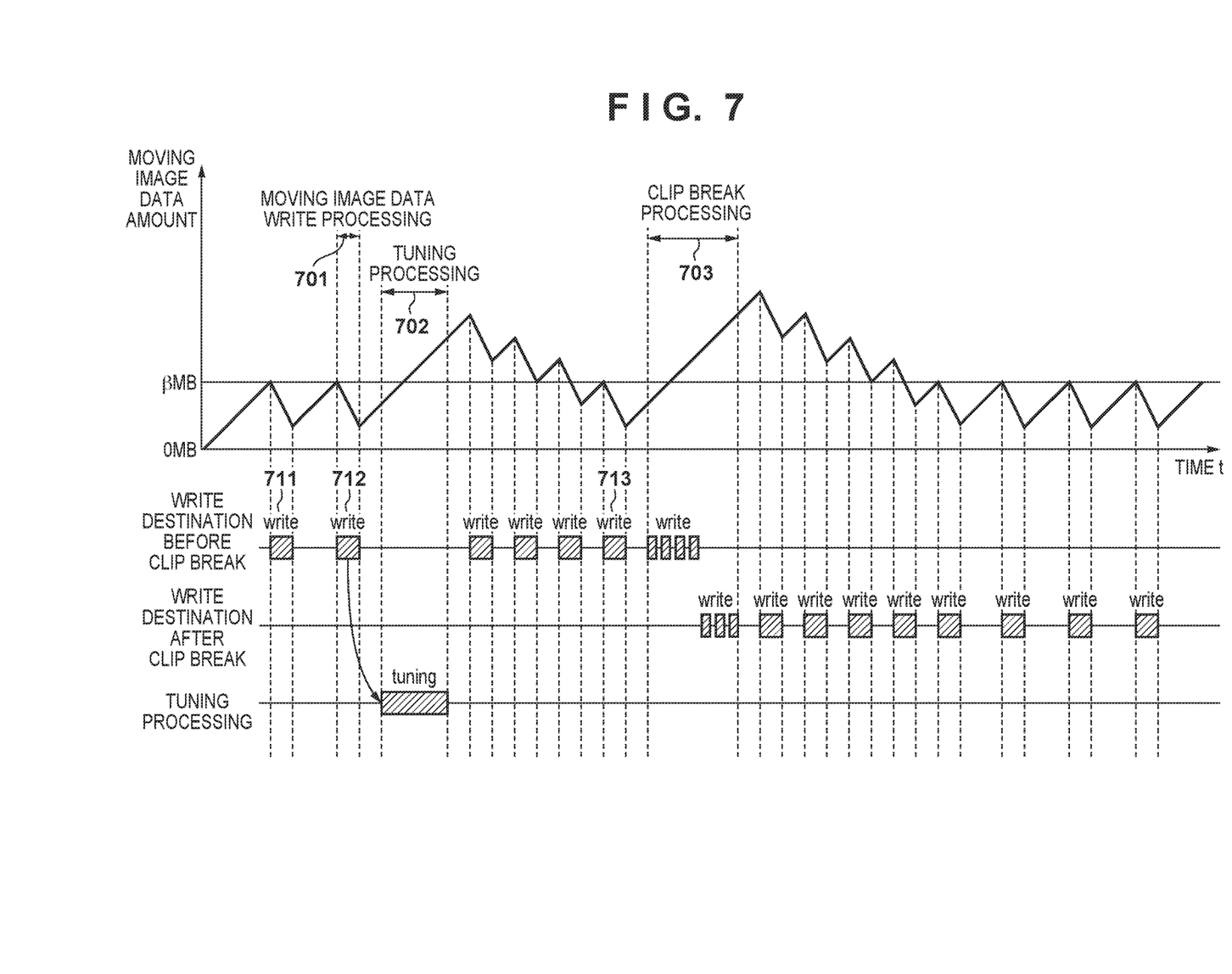
FIG. 7 is a diagram for describing a series of operations in the flowchart in FIG. 6.

FIG. 7 is a diagram showing a series of operation in the flowchart in FIG. 6 in chronological order, using the transitions in the accumulation state of the moving image data buffer during the recording of the moving image, and time for write processing and tuning processing. In FIG. 7, the vertical axis indicates amount of moving image data accumulated in the moving image data buffer, and the horizontal axis indicates time t. Note that the moving image data buffer is allocated to the DRAM 116.

Reference sign 701 indicates a period in which the moving image data accumulated in the moving image data buffer is written to the flash memory card 115 in step S303. Reference sign 702 indicates a period in which tuning processing of the flash memory card 115 is performed in step S307. Reference sign 703 indicates a period in which the moving image data and the managing information are written to the flash memory card 115 accompanying the clip break processing in step S605.

In writing timing 711 for the moving image data, the main microcomputer 118 determines that the sum of the total frame count $\gamma 1$ of the written moving image data, the frame count $\alpha 1$ per tuning processing time, and the frame count $\beta 1$ per write size $\beta$ has not reached the clip break frame count $\delta 1$.

In writing timing 712 for the moving image data, the main microcomputer 118 determines that the sum of the total frame count $\gamma 1$ of the written moving image data, the frame count $\alpha 1$ per tuning processing time, and the frame count $\beta 1$ per write size $\beta$ has reached the clip break frame count $\delta 1$, and performs tuning processing in the period 702. In this way, in the second embodiment, the main microcomputer 118 changes the tuning execution timing according to the tuning processing time.

In writing timing 713 for the moving image data, the main microcomputer 118 determines that the total frame count $\gamma 1$ of the moving image data that has been written to the flash memory card 115 has reached the clip break frame count $\delta 1$. Then, main microcomputer 118 performs data write processing for the clip break processing in period 703.

In FIG. 7, the period 702 corresponding to tuning processing time is longer than the period corresponding to one instance of writing (writing of the write size $\beta$) of moving image data. Therefore, the tuning processing is performed in the timing in which writing, four-instances-prior to writing timing 713 in which the total frame count $\gamma 1$ will reach the clip break frame count $\delta 1$, has been performed.

As described above, according to the second embodiment, the digital camera 100 changes the tuning execution timing according to the tuning processing time. Thus, it is possible to reduce the likelihood that clip break processing (or file break processing) will start in a timing when the available capacity in the moving image data buffer is small.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-059691, filed Mar. 24, 2017, which is hereby incorporated by reference herein in its entirety.

What is claimed is:

1. A recording apparatus comprising:
    an output unit configured to output a clock signal to a storage medium;
    an input/output unit configured to output a write command and data to be written to the storage medium according to the clock signal in order to write data to the storage medium, and configured to receive data from the storage medium according to a timing signal;
    a generation unit configured to generate the timing signal by delaying the clock signal;
    an adjustment unit configured to execute adjustment processing for adjusting a delay amount of the timing signal;
    a recording control unit configured to perform recording control for performing recording of data to a file in the storage medium using the input/output unit, and configured to change a recording destination of data from the file to a new file in response to a data amount recorded in the file reaching a threshold or more;
    a control unit configured to control such that the adjustment processing is performed in response to a sum of the data amount recorded in the file and a first data amount that is greater than or equal to a data amount corresponding to one instance of recording using the input/output unit reaching the threshold or more.

2. The recording apparatus according to claim 1, wherein the first data amount is equal to the data amount corresponding to one instance of recording using the input/output unit.

3. The recording apparatus according to claim 1, wherein the data amount corresponding to one instance of recording using the input/output unit is a data amount to be written to the storage medium by the write command.

4. The recording apparatus according to claim 1, further comprising
    a buffer memory to which data to be recorded to the storage medium is continuously input,
    wherein the first data amount is greater than or equal to a sum of the data amount corresponding to one instance of recording using the input/output unit and a data amount that is input to the buffer memory in processing time required for the adjustment processing.

5. The recording apparatus according to claim 4, further comprising
    an acquiring unit configured to acquire the processing time required for the adjustment processing.

6. The recording apparatus according to claim 5, wherein the acquiring unit acquires the processing time by causing the adjustment unit to execute the adjustment processing before the input of the data to be recorded to the buffer memory is started.

7. The recording apparatus according to claim 4, wherein the first data amount is equal to the sum of the data amount corresponding to one instance of recording using the input/output unit and the data amount that is input to the buffer memory in the processing time.

8. The recording apparatus according to claim 1, wherein the threshold is a predetermined number of bits or bytes.

9. The recording apparatus according to claim 1, wherein data to be recorded using the recording control is moving image data, and
    the threshold is a predetermined frame count.

10. The recording apparatus according to claim 1, further comprising an image capturing unit,
    wherein the recording control unit records moving image data acquired by the image capturing unit as a moving image file in the storage medium.

11. A control method executed by a recording apparatus comprising:
    an output unit configured to output a clock signal to a storage medium;
    an input/output unit configured to output a write command and data to be written to the storage medium according to the clock signal in order to write data to the storage medium, and configured to receive data from the storage medium according to a timing signal; and
    a generation unit configured to generate the timing signal by delaying the clock signal,
    the control method comprising:
    executing adjustment processing for adjusting a delay amount of the timing signal;
    performing recording control for performing recording of data to a file in the storage medium using the input/output unit, and changing a recording destination of data from the file to a new file in response to a data amount recorded in the file reaching a threshold or more; and
    controlling such that the adjustment processing is performed in response to a sum of the data amount recorded in the file and a first data amount that is greater than or equal to a data amount corresponding to one instance of recording using the input/output unit reaching the threshold or more.

12. A non-transitory computer-readable storage medium which stores a program for causing a computer of a recording apparatus to execute a control method, the recording apparatus comprising:
    an output unit configured to output a clock signal to a storage medium;
    an input/output unit configured to output a write command and data to be written to the storage medium according to the clock signal in order to write data to the storage medium, and configured to receive data from the storage medium according to a timing signal; and
    a generation unit configured to generate the timing signal by delaying the clock signal,
    the control method comprising:
    executing adjustment processing for adjusting a delay amount of the timing signal;
    performing recording control for performing recording of data to a file in the storage medium using the input/ output unit, and changing a recording destination of data from the file to a new file in response to a data amount recorded in the file reaching a threshold or more; and controlling such that the adjustment processing is performed in response to a sum of the data amount recorded in the file and a first data amount that is greater than or equal to a data amount corresponding to one instance of recording using the input/output unit reaching the threshold or more.

* * * * *